United States Patent
Kim

(10) Patent No.: US 8,537,616 B2
(45) Date of Patent: Sep. 17, 2013

(54) NONVOLATILE MEMORY DEVICE AND METHOD FOR OPERATING THE SAME

(75) Inventor: Nam-Kyeong Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 71 days.

(21) Appl. No.: 13/347,064

(22) Filed: Jan. 10, 2012

(65) Prior Publication Data

US 2012/0287713 A1    Nov. 15, 2012

(30) Foreign Application Priority Data

May 12, 2011   (KR) .................. 10-2011-0044769

(51) Int. Cl.
    *G11C 16/08*    (2006.01)

(52) U.S. Cl.
    USPC ............ 365/185.11; 365/185.18; 365/185.23; 365/185.27; 365/185.29

(58) Field of Classification Search
    None
    See application file for complete search history.

(56) References Cited

U.S. PATENT DOCUMENTS 5,402,382 A * 3/1995 Miyawaki et al. ............ 365/218
5,544,117 A * 8/1996 Nakayama et al. ...... 365/185.22
6,711,058 B1 * 3/2004 Hirano ..................... 365/185.11

* cited by examiner

*Primary Examiner* — Tan T. Nguyen
(74) *Attorney, Agent, or Firm* — IP & T Group LLP

(57) ABSTRACT

A nonvolatile memory device includes a plurality of memory blocks and a high voltage application unit configured to apply a high voltage to a word line of a memory block unselected from among the plurality of memory blocks and float the word line, during the erase operation.

14 Claims, 3 Drawing Sheets

NONVOLATILE MEMORY DEVICE AND METHOD FOR OPERATING THE SAME

CROSS-REFERENCE TO RELATED APPLICATIONS

The present application claims priority of Korean Patent Application No. 10-2011-0044769, filed on May 12, 2011, which is incorporated herein by reference in its entirety.

BACKGROUND

1. Field

Exemplary embodiments of the present invention relate to a nonvolatile memory device and a method for operating the same, and more particularly, to a nonvolatile memory device performing an erase operation and a method for operating the same.

2. Description of the Related Art

A nonvolatile memory device refers to a memory device which maintains data stored therein even though power supply is cut off. Currently, a variety of nonvolatile memory devices, for example, a NAND-type flash memory and so on are widely used.

The nonvolatile memory device having a plurality of memory cells may perform a program operation to write data in memory cells, an erase operation to erase data written in memory cells, and a read operation to read data written in memory cells.

Here, the erase operation of the nonvolatile memory device is performed per memory block of memory cells. This may be more specifically described as follows.

When an erase operation begins, a ground voltage 0V is applied to word lines of a selected memory block, while word lines of an unselected memory block stay in a floating state after the ground voltage 0V is applied. In such a state, when a high voltage called an erase voltage is applied to a substrate, data of memory cells belonging to the selected memory block are erased by a voltage difference between the word lines and the substrate, i.e., a difference between the ground voltage applied to the word lines and the erase voltage applied to the substrate. On the other hand, since the word lines of the unselected memory block stay in a floating state, the voltages of the word lines are boosted when the erase voltage is applied to the substrate. Accordingly, a voltage difference between the word lines and the substrate disappears in the unselected memory block. Therefore, the data of the memory cells belonging to the unselected memory block are suppressed/prevented from being erased.

During such an erase operation, however, although the data erase of the memory cells in the unselected memory block is to be suppressed, data of partial memory cells may be substantially erased. That is, a so-called erase disturbing may occur. This is because the voltages of the floating word lines of the unselected memory block are not adequately boosted but lowered to a certain level or less.

When such an erase disturbing occurs, the reliability of the nonvolatile memory device may be reduced, and malfunction may occur.

SUMMARY

An embodiment of the present invention is directed to a nonvolatile memory device capable of modifying an erase operation properties and a method for operating the same.

In accordance with an embodiment of the present invention, a nonvolatile memory device includes: a plurality of memory blocks; and a high voltage application unit configured to apply a high voltage to a word line of a memory block unselected from among the plurality of memory blocks and float the word line, during an erase operation.

In accordance with another embodiment of the present invention, a method for operating a nonvolatile memory device includes: applying a high voltage to a word line of a memory block unselected from among a plurality of memory blocks in an erase operation mode; floating the word line to which the high voltage is applied; and applying an erase voltage to a substrate.

In accordance with further embodiment of the present invention, a nonvolatile memory device includes: a plurality of memory blocks; a plurality of row decoders corresponding to the respective memory blocks and each configured to apply a ground voltage to word lines of a corresponding memory block and float the word lines when the memory block is unselected in an erase operation mode; and a plurality of high voltage application units corresponding to the respective memory blocks and each configured to apply a high voltage to word lines of a corresponding memory block and float the word lines when the memory block is unselected in an erase operation mode.

DETAILED DESCRIPTION

Figure 1:
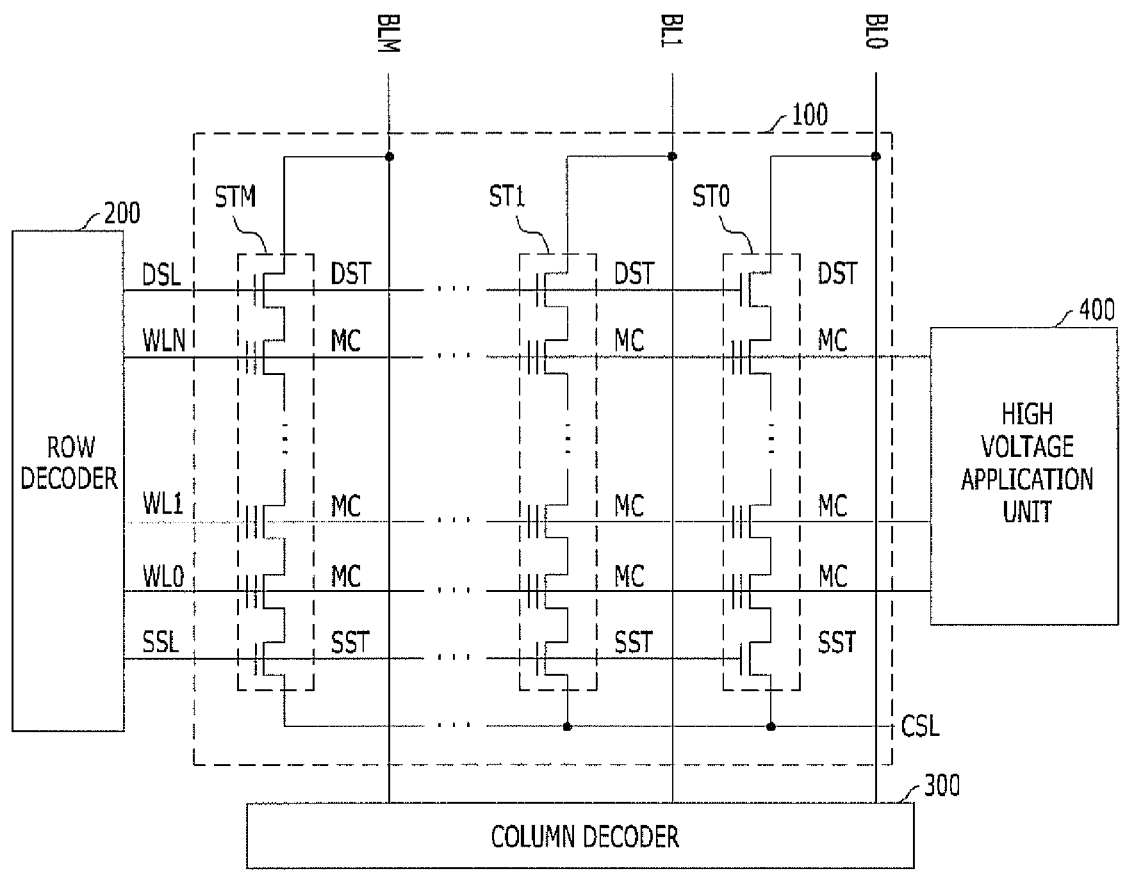
FIG. 1 is a diagram illustrating the configuration of a nonvolatile memory device in accordance with an embodiment of the present invention.

Exemplary embodiments of the present invention will, be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

When the embodiments of the present invention are described, the descriptions will be focused on an erase operation, and detailed descriptions of a read or program operation will be omitted.

Figure 2:
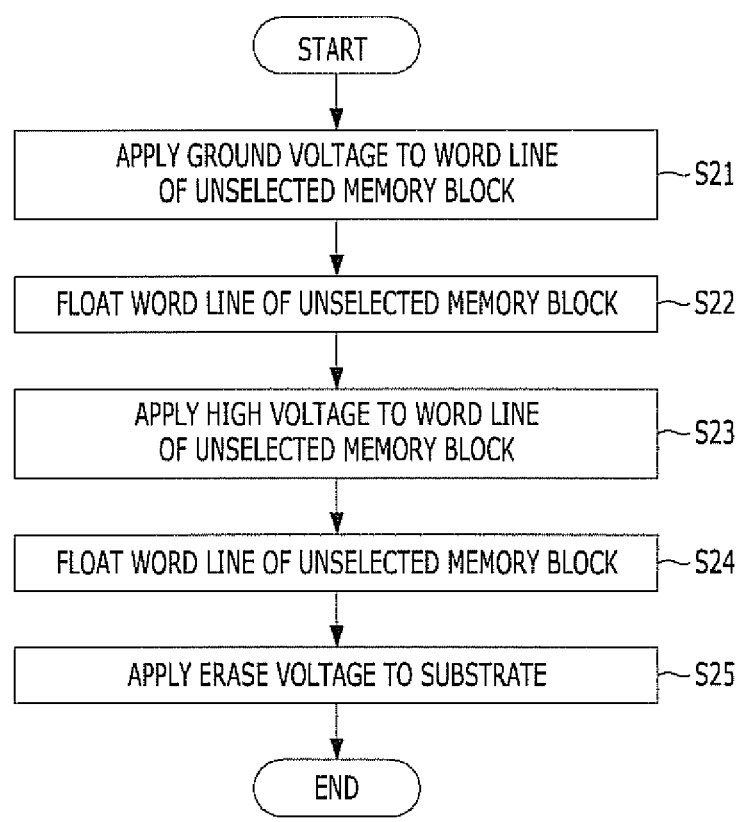
FIG. 2 is a flow chart illustrating an operation method of the device of FIG. 1.
Figure 3:
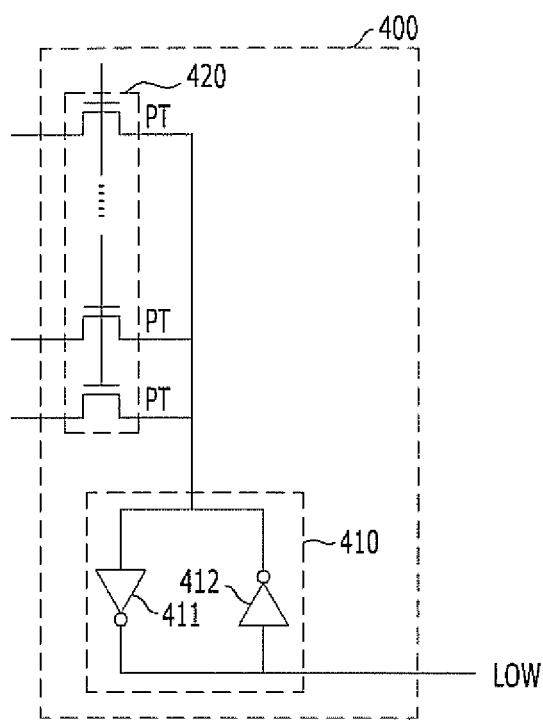
FIG. 3 illustrates an example of a high voltage application unit of FIG. 1.

Referring to FIGS. 1 to 3, a nonvolatile memory device and a method for operating the same in accordance with an embodiment of the present invention will be described. FIG. 1 is a diagram illustrating the configuration of the nonvolatile memory device in accordance with the embodiment of the present invention. FIG. 2 is a flow chart illustrating the operation method of the device of FIG. 1. FIG. 3 illustrates an example of a high voltage application unit of FIG. 1.

Referring to FIG. 1, the nonvolatile memory device in accordance with the embodiment of the present invention includes a memory block 100, a row decoder 200, a column decoder 300, and a high voltage application unit 400. FIG. 1 illustrates one memory block 100 provided with a row decoder 200, a column decoder 300, and a high voltage application unit 400. However, the nonvolatile memory device in accordance with the embodiment of the present invention may include a plurality of memory blocks each having a row decoder, a column decoder, and a high voltage application unit.

The memory block 100 includes a plurality of bit lines BL0 to BLM extending in one direction, for example, a column direction, a common source line CSL extending in another direction, for example, a row direction crossing the column direction, and a plurality of strings ST0 to STM arranged between the bit lines BL0 to BLM and the common source line SCL, respectively. Here, each of the strings ST0 to STM includes a source selection transistor SST, a plurality of memory cells MC, and a drain selection transistor DST, which are coupled in series. The gate of the source selection transistor SST in each of the strings ST0 to STM is coupled to a source selection line SSL extending in the row direction, the gates of the memory cells MC in each of the strings ST0 to STM are coupled to word lines WL0 to WLN extending in the row direction, and the gate of the drain selection transistor DST in each of the strings ST0 to STM is coupled to a drain selection line DSL extending in the row direction.

An erase operation is performed per memory block 100. That is, the memory block 100 may be one of a selected memory block which is an erase target and an unselected memory block which is not to be erased when the selected memory block is erased, depending on a signal inputted to the row decoder 200 which will be described below.

The row decoder 200 may be disposed on one side of the memory block 100 and electrically coupled to the drain selection line DSL, the word lines WL0 to WLN, and the source selection line SSL. The row decoder 200 applies a proper operation voltage, which is used according to each operation mode such as erase/read/program operation, to the drain selection line SSL, the word lines WL0 to WLN, and the source selection line SSL.

In particular, the row decoder 200 applies a ground voltage 0V to the word lines WL0 to WLN of the memory block 100 or floats the word lines WLD to WLN, depending on whether the memory block 100 is a selected memory block or unselected memory block, in the erase operation mode.

The column decoder 300 is disposed on another side of the memory block 100 and electrically coupled to the bit lines BL0 to BLN so as to control the bit line BL0 to BLN according to each operation mode such as erase/read/program operation. As well known, the column decoder 300 may include a plurality of page buffers and so on, and the detailed descriptions thereof are omitted herein.

The high voltage application unit 400 is a circuit for applying a high voltage having a set level to the respective word lines WL0 to WLN, when the memory block 100 is an unselected memory block in the erase operation mode. The high voltage application unit 400 may be disposed on another side of the memory block 100 and electrically coupled to the other ends of the word lines WL0 to WLN against the one ends coupled to the row decoder 200. In other words, one end of the word lines WL0 to WLN of the memory block 100 may be coupled to the row decoder 200, and the other ends thereof may be coupled to the high voltage application unit 400.

Substantially, the word lines WL0 to WLN are controlled by the decoder 200 during most operation time and controlled by the high voltage application unit 400 only during part of the time in the erase operation mode.

Hereinafter, referring to FIGS. 1 and 2, an operation method of the nonvolatile memory device of FIG. 1, or particularly, an erase operation method will be described. In this embodiment of the present invention, an operation of the memory block 100 as an unselected memory block is described.

First, when an erase command signal and a block select signal for selecting an erase target memory block are inputted to the row decoder 200, the row decoder 200 applies a much lower voltage than an erase voltage, for example, a ground voltage 0V to the word lines WL0 to WLN of the unselected memory block 100 at step S21. The erase voltage will be described below. At this time, since the operation of the memory block 100 as an unselected memory block is described, the block select signal applied to the row decoder 200 may include an unselect signal. At this step, the ground voltage 0V is also applied to word lines of a selected memory block (not illustrated) by a row decoder provided in the selected memory block. At this time, the erase command signal and the block select signal may also be inputted to the high voltage application unit 400. The high voltage application unit 400 operates when an unselect signal is inputted, which will be described below.

The row decoder 200 floats the word lines WL0 to WLN of the unselected memory block 100 at step S22. At this step, the word lines of the selected word line (not illustrated) are maintained in a state in which the ground voltage 0V is applied.

The floating of the word lines WL0 to WLN of the unselected memory block 100 may be performed by the following method. The row decoder 200 may include high voltage pass transistors (not illustrated) coupled to one ends of the word lines WL0 to WLN, respectively. The high voltage pass transistors may be turned off to block the electrical coupling between the row decoder 200 and the word lines WL0 to WLN, thereby floating the word lines WL0 to WLN. Since the configuration of the high voltage pass transistors included in the row decoder 200 is well known, the detailed drawing and descriptions thereof are omitted in this specification.

When the step S22 is completed, a detection signal notifying the high voltage application unit 400 of the completion may be transferred to the high voltage application unit 400.

When the detection signal is applied in addition to the erase command signal and the unselect signal, the high voltage application unit 400 applies a high voltage having a set level to the word lines WL0 to WLN of the unselected memory block 100 staying in a floating state, at step S23. At this step, the high voltage application unit coupled to the selected memory block (not illustrated) is not operated in response to a select signal. Accordingly, the word lines of the selected memory block are maintained in a state in which the ground voltage 0V is applied.

Here, the high voltage having a set level is controlled to have such a value as to suppress the data erase of the memory cells MC of the unselected memory block 100, when an erase voltage is applied to the substrate (refer to step S25). For example, when the word lines WL0 to WLN of the unselected memory block 100 are floated again at step S24 and boosted to a boosting voltage by applying the erase voltage to the substrate at step S25, the high voltage having a set level may be controlled to have a value corresponding to (the erase voltage)-(the boosting voltage). For example, when the erase voltage is about 15V, the high voltage having a set level may have a value ranging from 5V to 7V.

The high voltage application unit 400 floats the word lines WL0 to WLN of the unselected memory block 100 receiving the high voltage at the step S24. At this step, the high voltage application unit provided in the selected memory block (not illustrated) does not operate as in the step S23. Accordingly, the word lines of the selected memory block are maintained in a state in which the ground voltage 0V is applied.

The floating of the word lines WL0 to WLN of the unselected memory block 100 by the high voltage application unit 400 may be performed by the following method. The high voltage application unit 400 may include pass transistors (not illustrated) coupled to the other ends of the word lines WL0 to WLN against the one ends coupled to the row decoder 200. The pass transistors may be turned off to block the electrical coupling between the high voltage application unit 400 and the word lines WL0 to WLN, thereby floating the word lines WL0 to WLN. The specific configuration of the high voltage application unit 400 will be described with reference to FIG. 3 below.

At the step S25, the erase voltage is applied to the substrate. At this time, since the word lines WL0 to WLN of the unselected memory block 100 are floated in a state in which the high voltage is applied, the word lines WL0 to WLN of the unselected memory block 100 have a high voltage corresponding to (the high voltage)+(the boosting voltage), when the erase voltage is applied to the substrate. Therefore, the data of the memory cells MC of the unselected memory block 100 may be prevented from being erased. On the other hand, at this step, since the word lines of the selected memory block (not illustrated) are maintained in a state in which the ground voltage is applied, the data of the memory cells are erased by a voltage difference between the word lines and the substrate.

Hereafter, referring to FIG. 3, the specific configuration and operation of the high voltage application unit 400 will be described.

The high voltage application unit 400 includes a latch section 410 and a switch section 420.

The latch section 410 is configured to store a high-level voltage corresponding to the high voltage. The latch section 410 may include two inverters 411 and 412. Accordingly, the latch section 410 may invert a low-level voltage inputted from outside into a high-level voltage to be stored therein.

The switch section 420 includes a plurality of pass transistors PT. One ends of the pass transistors PT are coupled to the respective word lines WL0 to WLN of the memory block 100. The other ends of the pass transistors PT are coupled to the latch section 410, or particularly, to a node to which a high-level voltage is applied. A gate line for coupling the gates of the pass transistors PT is coupled to another voltage application unit (not illustrated), and turn on/off of the pass transistors PT is controlled by the voltage application unit.

In the high voltage application unit 400, the high-level voltage corresponding to the high voltage is stored in the latch section 410. Then, when the word lines WL0 to WLN of the unselected memory block 100 are floated by the row decoder 200, the pass transistors PT of the switch section 420 are turned on to apply the high-level voltage to the word lines WL0 to WLN of the unselected memory block 100. Subsequently, as the pass transistors PT of the switch section 420 are turned off, the word lines WL0 to WLN of the unselected memory block 100 may be floated in such a state as the high voltage is applied thereto.

FIG. 3 illustrates an example in which the high voltage application unit 400 is designed using the latch section 410 and the switch section 420 including the pass transistors PT. However, various circuits capable of applying a high voltage to the word lines WL0 to WLN of the memory block 100 may be designed.

In accordance with the embodiments of the present invention, the nonvolatile memory device and the method for operating the same may modify the erase operation characteristic.

While the present invention has been described with respect to the specific embodiments, it will be apparent to those skilled in the art that various changes and modifications may be made without departing from the spirit and scope of the invention as defined in the following claims.

What is claimed is:

1. A nonvolatile memory device comprising:
   a plurality of memory blocks; and
   a high voltage application unit configured to apply a high voltage to a word line of a memory block unselected from among the plurality of memory blocks and float the word line, during an erase operation.

2. The nonvolatile memory device of claim 1, further comprising a row decoder coupled to one end of a word line of each of the memory blocks,
   wherein the high voltage application unit is coupled to the other end of the word line of the unselected memory block.

3. The nonvolatile memory device of claim 2, wherein the row decoder is configured to apply a ground voltage to the word line of the unselected memory block and float the word line before high voltage application unit is configured to apply the high voltage to the word line of the unselected memory block and float the word line, during the erase operation.

4. The nonvolatile memory device of claim 1, wherein the high voltage application unit comprises:
   a latch section configured to store the high voltage; and
   a switch section configured to transfer the voltage stored in the latch section to the word line of the unselected memory block.

5. The nonvolatile memory device of claim 1, wherein the high voltage is set to have a voltage level for the word line of the unselected memory block to be boosted from a level of the high voltage to a level of an erase voltage when the erase voltage is applied to a substrate during the erase operation.

6. A method for operating a nonvolatile memory device, comprising:
   applying a high voltage to a word line of a memory block unselected from among a plurality of memory blocks in an erase operation mode;
   floating the word line to which the high voltage is applied; and
   applying an erase voltage to a substrate.

7. The method of claim 6, further comprising applying a ground voltage to the word line of the unselected memory block and floating the word line, before the applying of the high voltage.

8. The method of claim 6, wherein the high voltage is set to have a voltage level for the word line of the unselected memory block to be boosted from a level of the high voltage to a level of the erase voltage in the applying of the erase voltage.

9. A nonvolatile memory device comprising:
   a plurality of memory blocks;
   a plurality of row decoders corresponding to the respective memory blocks and each configured to apply a ground voltage to word lines of a corresponding memory block and float the word lines when the memory block is unselected in an erase operation mode; and
   a plurality of high voltage application units corresponding to the respective memory blocks and each configured to apply a high voltage to word lines of a corresponding memory block and float the word lines when the memory block is unselected in an erase operation mode.

10. The nonvolatile memory device of claim 9, wherein each of the row decoders is configured to apply the ground voltage to word lines of a corresponding memory block when the memory block is selected in the erase operation mode, and each of the high voltage application units is deactivated when a corresponding memory block is selected in the erase operation mode.

11. The nonvolatile memory device of claim 9, wherein each of the row decoders is coupled to one ends of the word lines of the corresponding memory block, and
- each of the high voltage application units is coupled to the other ends of the word lines of the corresponding memory block.

12. The nonvolatile memory device of claim 9, wherein an operation of the row decoder corresponding the unselected memory block is performed before an operation of the high voltage application unit corresponding the unselected memory block in the erase operation mode.

13. The nonvolatile memory device of claim 9, wherein each of the high voltage application units comprises:
- a latch section configured to store the high voltage; and
- a switch section configured to transfer the high voltage stored in the latch section to the word lines of the unselected memory block.

14. The nonvolatile memory device of claim 9, wherein the high voltage is set to have a voltage level for the word lines of the unselected memory block to be boosted from a level of the high voltage to a level of an erase voltage when the erase voltage is applied to a substrate during the erase operation.

* * * * *